(12) United States Patent
Röhrer et al.

(10) Patent No.: US 9,551,765 B2
(45) Date of Patent: Jan. 24, 2017

(54) METHOD FOR OPERATING A HALL SENSOR ARRANGEMENT AND HALL SENSOR ARRANGEMENT

(75) Inventors: Georg Röhrer, Lebring (AT); Gerhard Oberhoffner, Graz (AT)

(73) Assignee: AMS AG, Unterpremstaetten (AT)

( * ) Notice: Subject to any disclaimer, the term of this patent is extended or adjusted under 35 U.S.C. 154(b) by 569 days.

(21) Appl. No.: 14/119,183

(22) PCT Filed: May 24, 2012

(86) PCT No.: PCT/EP2012/059728
§ 371 (c)(1),
(2), (4) Date: Feb. 12, 2014

(87) PCT Pub. No.: WO2012/160143
PCT Pub. Date: Nov. 29, 2012

(65) Prior Publication Data
US 2014/0163911 A1 Jun. 12, 2014

(30) Foreign Application Priority Data
May 24, 2011 (DE) ........................ 10 2011 102 483

(51) Int. Cl.
*G01R 19/00* (2006.01)
*G01R 25/00* (2006.01)
(Continued)

(52) U.S. Cl.
CPC ......... *G01R 33/072* (2013.01); *G01R 33/0029* (2013.01); *G01R 33/0035* (2013.01); *G01R 33/07* (2013.01); *G01R 33/075* (2013.01)

(58) Field of Classification Search
CPC .... G01D 5/14; G01D 5/24476; G01D 5/2448; G01D 5/142; G01D 5/145; F02D 41/009; G01R 33/07; G01K 13/00
(Continued)

(56) References Cited

U.S. PATENT DOCUMENTS 5,604,433 A 2/1997 Theus et al.
6,064,202 A 5/2000 Steiner et al.
(Continued)

FOREIGN PATENT DOCUMENTS

CA 2236861 3/1998
DE 4302342 A1 7/1993
(Continued)

OTHER PUBLICATIONS

Demierre, M:"Improvements of CMOS Hall Microsystems and Application for Absolute Angular Position Measurements", EPFL, Ecole Polytechnique Federale de Lausanne, Sep. 2003, pp. 1-194.
(Continued)

*Primary Examiner* — An Do
(74) *Attorney, Agent, or Firm* — McDermott Will & Emery LLP

(57) ABSTRACT

According to a method for operating a Hall sensor assembly, at least two values (I1, I2) of an input signal (I) of a Hall sensor (11) of the Hall sensor assembly (10) having different magnitudes are set and the associated values (V1, V2) of an output signal (V) of the Hall sensor (11) are determined. Furthermore, a residual offset value (k, VOFF) of the output signal (V) is determined according to the values (V1, V2) of the output signal (V) that were determined at the at least two values (I1, I2) of the input signal (I).

17 Claims, 8 Drawing Sheets

Figure 1A:
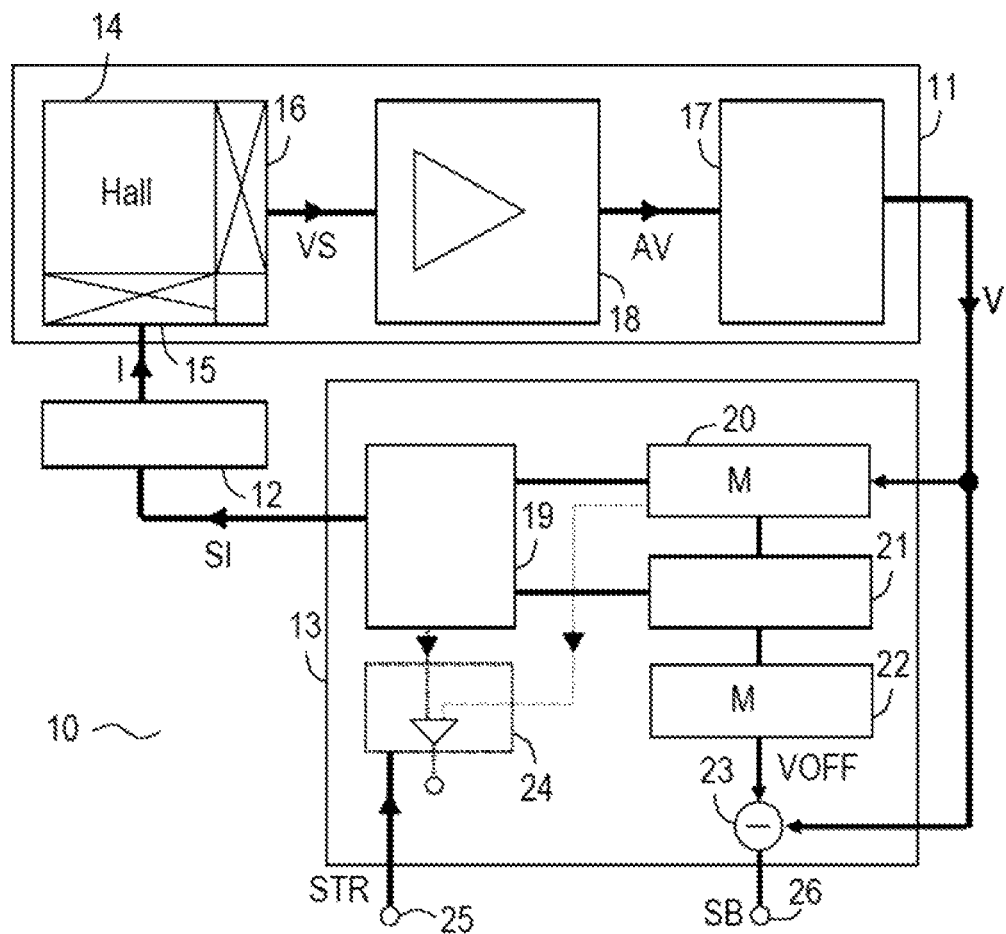

(51) Int. Cl.
*G01R 33/06* (2006.01)
*G01R 33/07* (2006.01)
*G01R 33/00* (2006.01)

(58) Field of Classification Search
USPC .............................. 702/57, 64, 65; 324/251
See application file for complete search history.

(56) References Cited

U.S. PATENT DOCUMENTS

| | | | |
|---|---|---|---|
| 6,740,980 | B2 | 5/2004 | Hirose |
| 6,768,301 | B1 | 7/2004 | Hohe et al. |
| 7,301,353 | B2 | 11/2007 | Ausserlechner |
| 8,311,760 | B2 | 11/2012 | Hohe et al. |
| 2008/0238410 | A1* | 10/2008 | Charlier ............ G01R 33/0017 324/202 |
| 2009/0261821 | A1* | 10/2009 | Motz .................... G01R 33/075 324/251 |

FOREIGN PATENT DOCUMENTS

| | | |
|---|---|---|
| DE | 4431703 A1 | 3/1996 |
| DE | 10313642 A1 | 10/2004 |
| DE | 102004021863 A1 | 12/2005 |
| DE | 69736944 T2 | 6/2007 |
| DE | 102007044471 A1 | 4/2009 |
| WO | 00/54068 A1 | 9/2000 |
| WO | 01/18556 A1 | 3/2001 |
| WO | 2005/073744 A1 | 8/2005 |

OTHER PUBLICATIONS

"Infineon Introduces new Liner Hall Sensors with Unique Temperature and Stress Compensation Features for Highly accurate Position Detection and Current Measurement", Infineon Technologies AG, Oct. 20, 2008, pp. 1-2, <http://www.presseagentur.com/Infineon/detail>.

Ruther, P. et al.: "Influence of the Junction Field Effect on the Offset Voltage of Integrated Hall Plates", The 16th European Conference on Solid-State Transducers, Sep. 15-18, 2002, Prag. Czech Republic, pp. 1209-1212.

"TLE4997 Programmable Linear Hall Sensor", Infineon Data Sheet, v. 2.08, Sep. 2008, pp. 1-34.

"TLE499C3, TLE4998C4 Programmable Linear Hall Sensor", Infineon Data Sheet, Rev. 1.0, Dec. 2008, pp. 1-44.

* cited by examiner

METHOD FOR OPERATING A HALL SENSOR ARRANGEMENT AND HALL SENSOR ARRANGEMENT

The present invention pertains to a method for operating a Hall sensor arrangement and a Hall sensor arrangement.

Hall sensor arrangements serve for determining a magnetic field. Hall sensors usually have an offset voltage, i.e., an output voltage other than zero, between two contacts of the Hall sensor as long as a current flows between two additional contacts of the Hall sensor, namely even when the Hall sensor is not situated in a magnetic field.

Document U.S. Pat. No. 6,064,202 describes a method for reducing the offset voltage of a Hall sensor by switching over terminals.

In the document "Influence of the Junction Field Effect on the Offset Voltage of Integrated Hall Plates," P. Ruther et al., Sixteenth European Conference on Solid-State Transducers, Sep. 15-18, 2002, Prague, Czech Republic, pp. 1209-1212, the dependence of the offset voltage on the input current is elucidated for different Hall components.

Document WO 00/54068 A1 concerns a method for the offset-compensated magnetic field measurement of a Hall sensor.

In an embodiment, a method for operating a Hall sensor arrangement comprises setting at least two values of an input signal of a Hall sensor of the Hall sensor arrangement that differ with respect to their amount. In addition, the associated values of an output signal of the Hall sensor are determined. Furthermore, a residual offset value of the output signal is determined in dependence on the values of the output signal that were determined at the at least two values of the input signal.

The offset portion of the output signal and the magnetic field-dependent useful portion of the output signal depend on the level of the input signal of the Hall sensor in different ways. Consequently, the residual offset value of the output signal can be advantageously determined by acting upon the Hall sensor with two values of the input signal that differ with respect to their amount. A calibration of the Hall sensor arrangement can be advantageously realized during the operation by determining the residual offset value. It is advantageous that the calibration can also be carried out when an external magnetic field with unknown magnetic field intensity is applied.

In an embodiment, the output signal is only provided after completely executing the phases of a cycle of the current spinning technique. In this case, the value of the input signal is constant during the phases of the cycle of the current spinning technique. The values of the output signal associated with the at least two values of the input signal are respectively provided by means of a separate cycle of the current spinning technique. The at least two values of the output signal are therefore determined at the at least two values of the input signal by means of at least two cycles of the current spinning technique. The current spinning technique can be referred to as current spinning technique, current spinning method or method of rotary operating currents. It is advantageous that the offset in the values of the output signal is already reduced by means of the current spinning technique before the residual offset value is determined by evaluating the at least two values of the output signal and the Hall sensor arrangement generates a magnetic field signal that has no offset influence or a significantly reduced offset influence. Consequently, the magnetic field signal advantageously indicates the magnetic field intensity with high accuracy.

The input signal may be realized in the form of a current or voltage.

In an embodiment, the residual offset value is determined in dependence on the at least two values of the input signal and the values of the output signal that were determined at the at least two values of the input signal. This means that not only the values of the output signal, but also the values of the input signal are included in the calculation.

In an alternative embodiment, the residual offset value is calculated from the amount of the at least two values of the input signal in dependence on the values of the output signal that were determined at the at least two values of the input signal and on a scaling factor between two values. For example, the scaling factor and one value of the amount of the at least two values of the input signal can be used in the determination of the residual offset value.

Alternatively, the scaling factor is used in the determination of the residual offset value. In this case, no value of the input signal is included in the calculation.

In an embodiment, the at least two values of the input signal are predefined values. Based on these predefined values of the input signal, the calculation of the residual offset value in the Hall sensor arrangement can be advantageously simplified in such a way that the values of the input signal are combined with other parameters in equations and are no longer explicitly indicated.

The residual offset value may be a residual offset voltage or an offset factor.

In an embodiment, a calibration phase takes place between a first and a second operating phase. The residual offset value is determined in the calibration phase. In the first and the second operating phase, in contrast, the value of the magnetic field is determined in dependence on the residual offset value.

In an embodiment, the Hall sensor arrangement is successively operated in a first calibration phase, a first operating phase, a second calibration phase and a second operating phase. Since the Hall sensor arrangement can be advantageously calibrated during its operation, the calibration phases and the operating phases can alternate several times. This makes it possible to reduce the influence of changes of the offset value that are caused by aging, temperature changes or mechanical stresses, e.g. during soldering processes.

In an embodiment, the calibration phase is triggered when a trigger signal is fed to the Hall sensor arrangement.

In an alternative embodiment, a clock signal that starts a calibration phase within predefined time intervals is generated. The clock signal particularly has a constant frequency.

In an alternative embodiment, the calibration phase is triggered when a temperature change of the Hall sensor arrangement is greater than a predefined limiting value. For this purpose, the Hall sensor arrangement comprises a temperature sensor that generates a temperature signal, by means of which the temperature change is detected.

The Hall sensor arrangement may be integrated into a system. Such a system may consist, e.g., of a motor vehicle, a machine tool, an electric current meter, a compass or a robot.

In an embodiment, the calibration phase is triggered when the system is in an idle state. The interferences are advantageously maintained low in an idle state of the system such that a particularly high accuracy is achieved in the determination of the residual offset value.

In an embodiment, the residual offset value is a residual offset voltage. The residual offset voltage can be calculated in accordance with the following equation:

$$VOFF = k \cdot I^n,$$

wherein VOFF is the value of the residual offset voltage, k is the value of an offset factor, I is the value of the input signal and n is the value of an exponent.

In an embodiment, the residual offset value is an offset factor. The offset factor can be calculated in accordance with the following equation:

$$k = \frac{VOFF}{I^n},$$

wherein VOFF is the value of the residual offset voltage, k is the value of the offset factor, I is the value of the input signal and n is the value of the exponent.

In an embodiment, the Hall sensor arrangement is suitable or designed for carrying out the method for operating a Hall sensor arrangement.

In an embodiment, the Hall sensor arrangement comprises a Hall sensor, a signal source and a determination unit. The signal source is coupled to an input of the Hall sensor. The determination unit is coupled to an output of the Hall sensor. The signal source is designed for providing at least two values of an input signal of the Hall sensor that differ with respect to their amount. Furthermore, the determination unit is designed for determining a residual offset value of an output signal of the Hall sensor in dependence on the values of the output signal that were determined at the at least two values of the input signal.

The residual offset value can be advantageously determined by means of two different values of the input signal.

In an embodiment, the Hall sensor comprises a Hall element and an input circuit that connects an input of the Hall sensor to the Hall element. The Hall sensor further comprises an output circuit and an evaluation circuit that connect the Hall element to an output of the Hall sensor. The output circuit and the evaluation circuit are connected to one another in series. An output signal is only provided by the evaluation circuit after completely executing the phases of a cycle of the current spinning technique. The input circuit, the output circuit and the evaluation circuit serve for carrying out the current spinning technique.

In an enhancement, at least one value of the input signal amounts to at least 1.5-times the smallest value of the input signal. In this way, two values of the input signal differ by at least 50% such that the values of the input signal and therefore the values of the output signal clearly differ. This simplifies a numerically stable calculation of the residual offset value.

The Hall sensor arrangement may comprise a semiconductor body. The semiconductor body may comprise a silicon substrate. The Hall sensor, the signal source and the determination unit are preferably arranged on a first primary surface of the semiconductor body.

In an embodiment, the Hall sensor arrangement comprises a coil. The coil may be arranged on the first primary surface of the semiconductor body. The coil may be arranged relative to the Hall sensor in such a way that the coil generates a magnetic field that is detected by the Hall sensor. In this case, the Hall sensor detects the sum of the external magnetic field and the magnetic field generated by the coil.

Figure 2A:
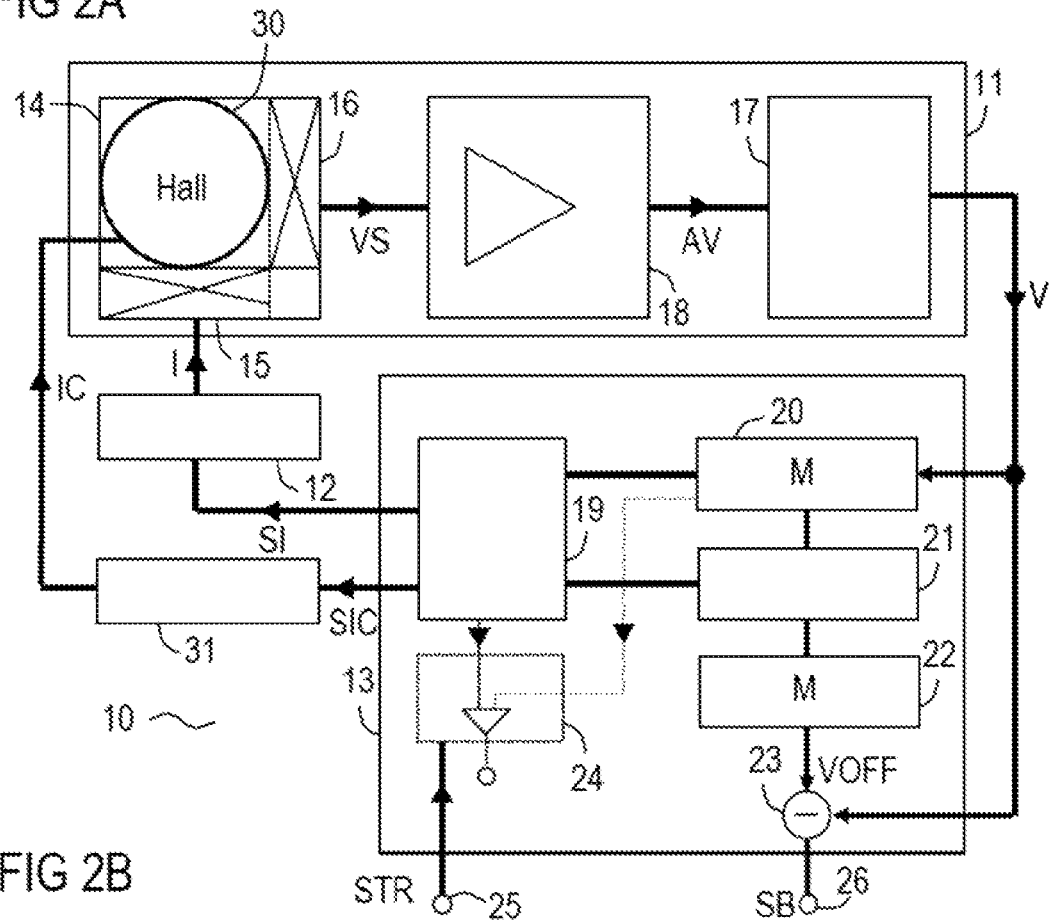
Figure 2B:
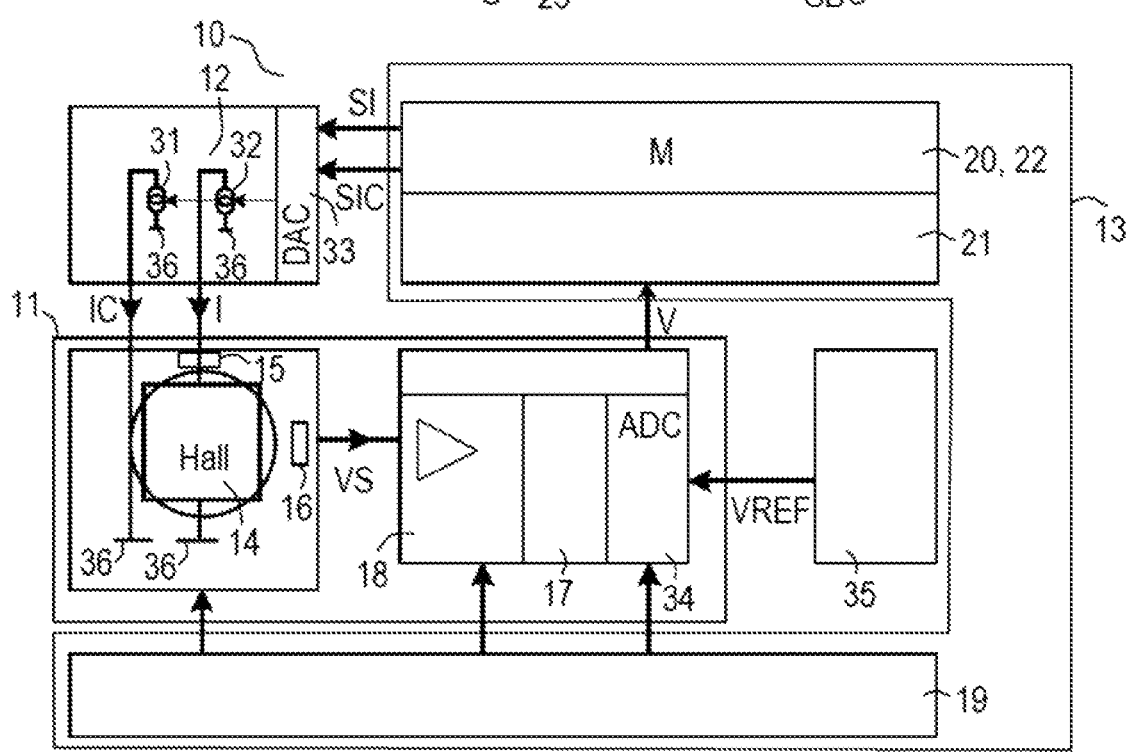
Figure 2C:
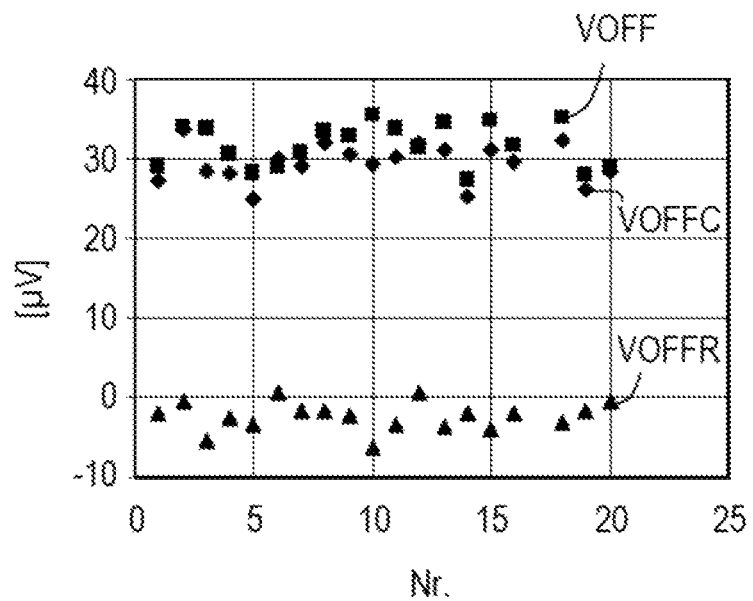
Figure 2D:
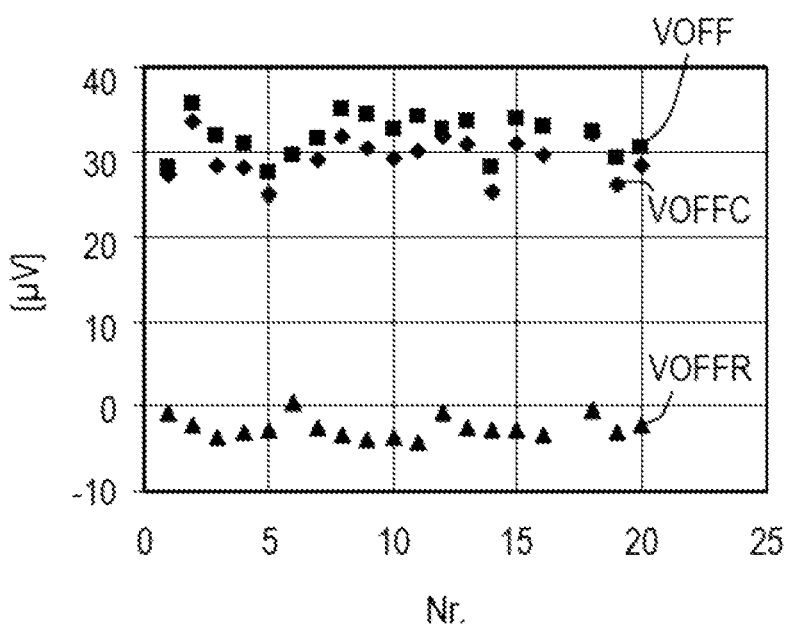
Figure 3A:
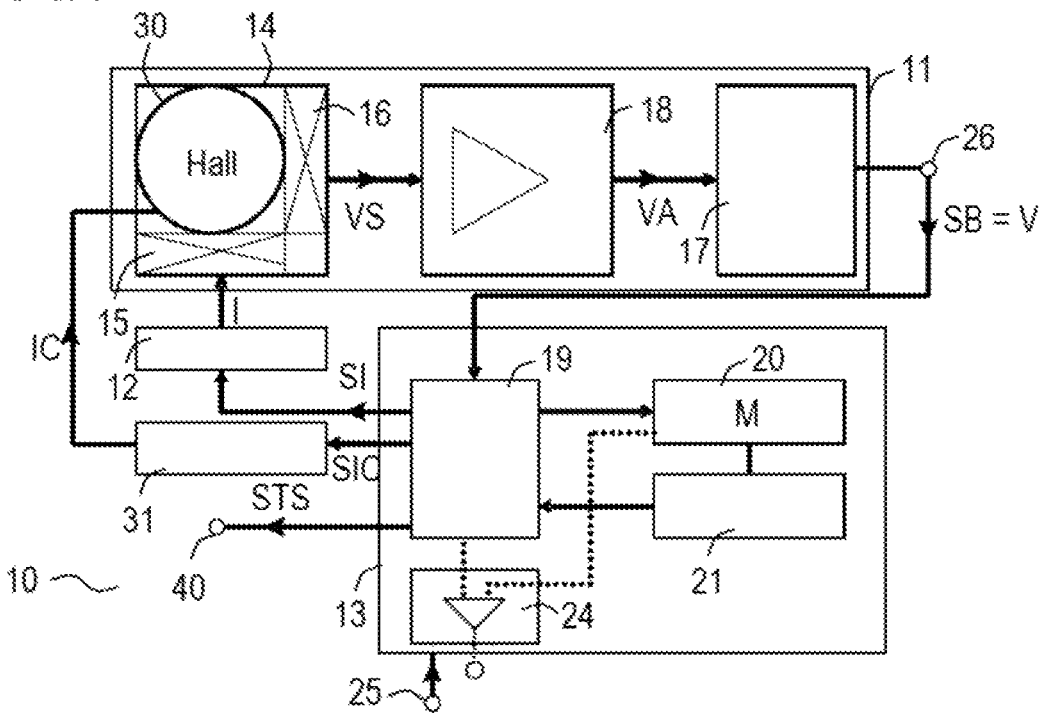
Figure 3B:
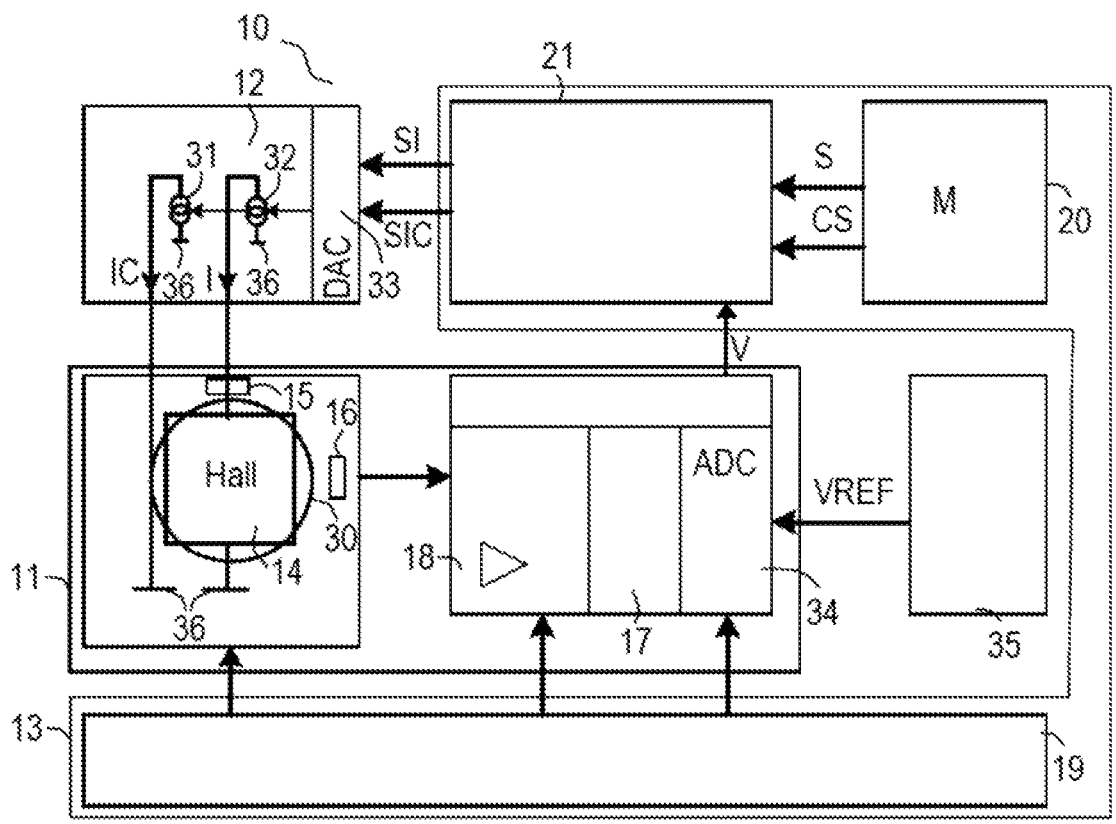
Figure 3C:
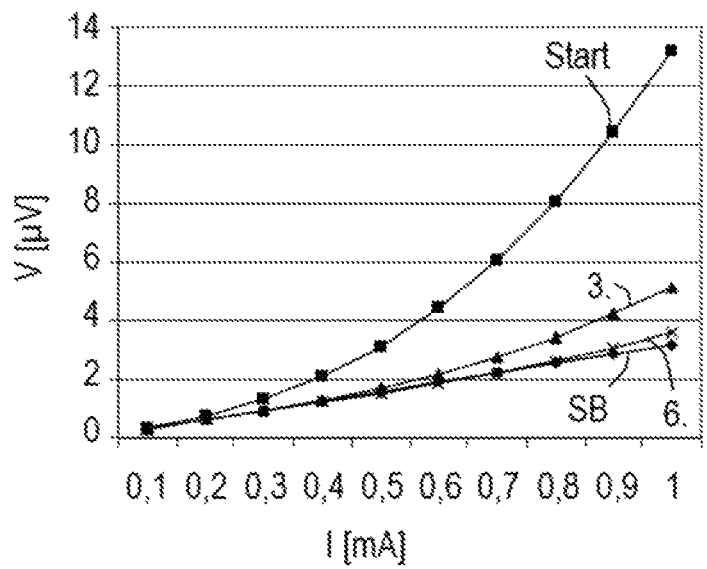
Figure 3D:
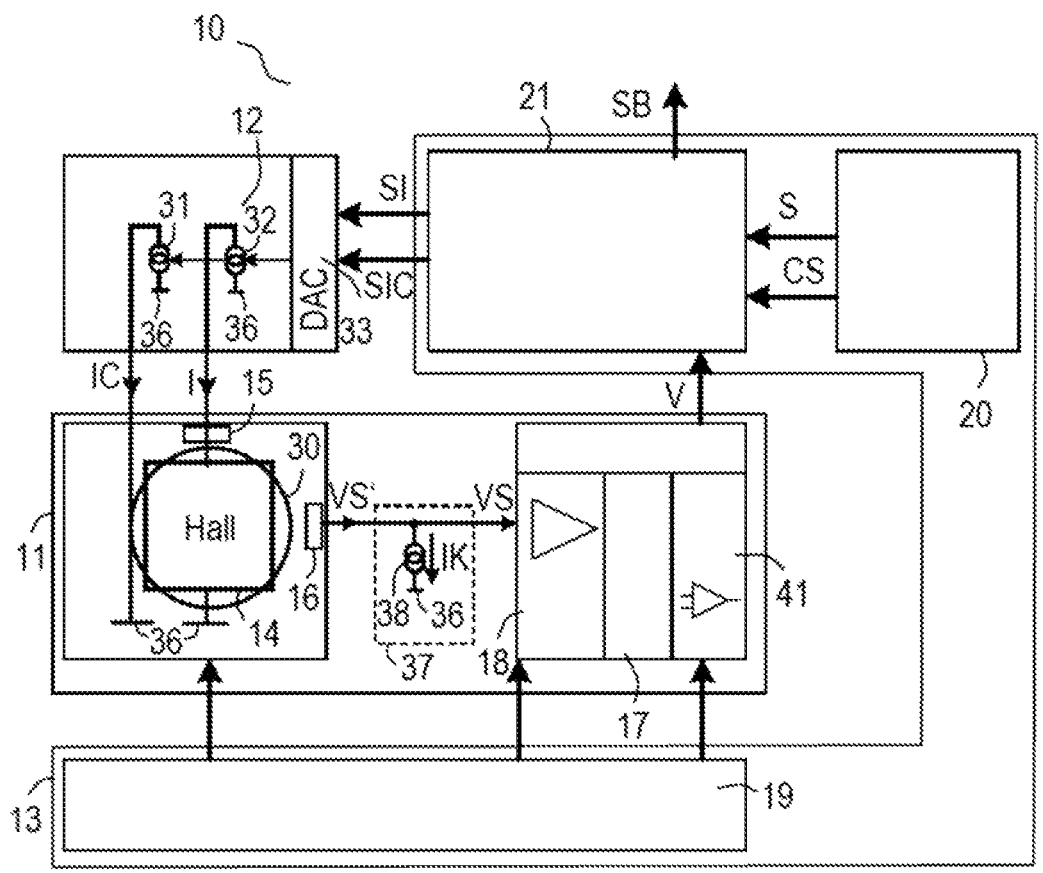
Figure 3E:
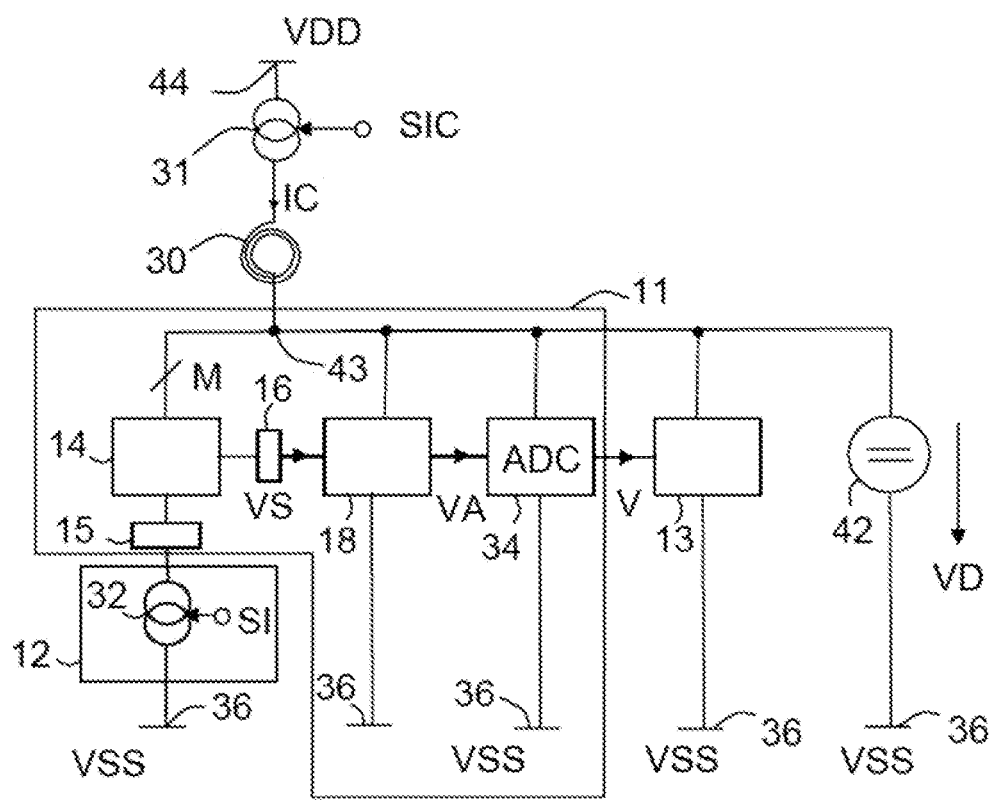
Figure 4A:
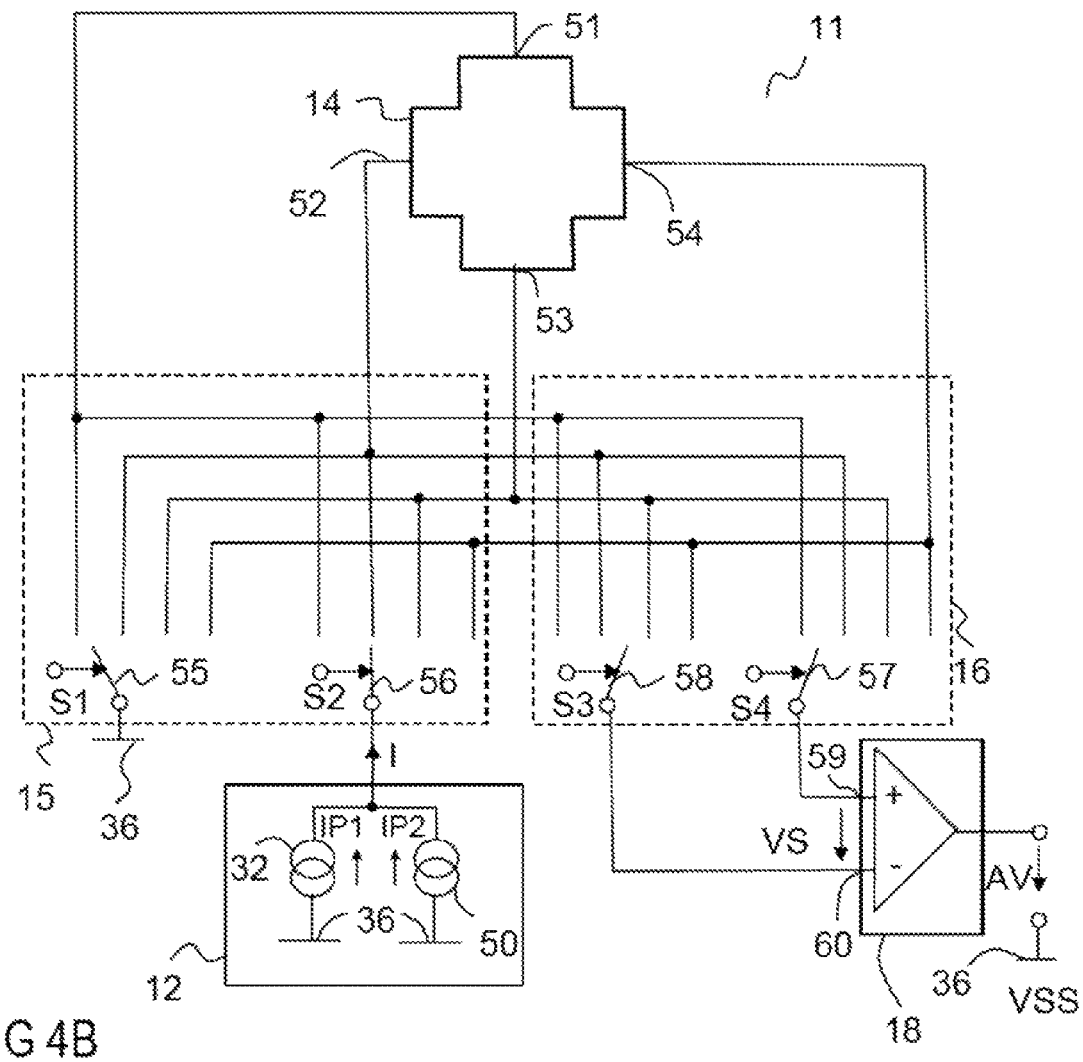
Figure 4B:
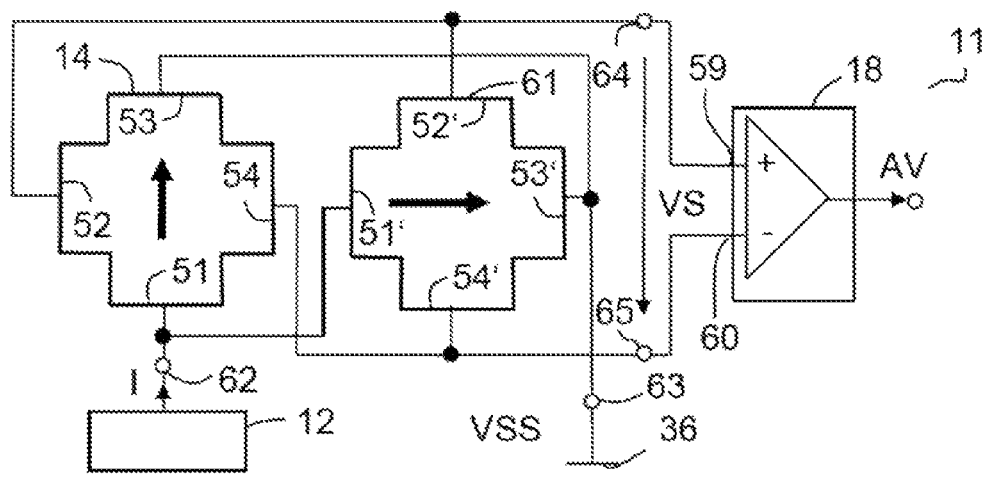

Several exemplary embodiments of the invention are described in greater detail below with reference to the figures. Components or functional units that respectively function or act identically are identified by the same reference symbols. The description of components or functional units that correspond with respect to their function is not repeated in each of the following figures. In these figures:

FIGS. 1A to 1D show an exemplary embodiment of a Hall sensor arrangement that is suitable for carrying out a first and a second embodiment of the method for operating a Hall sensor arrangement, as well as exemplary measurement results, FIGS. 2A to 2D show other exemplary embodiments of the Hall sensor arrangement that are designed for carrying out a third and a fourth embodiment of the method for operating a Hall sensor arrangement, as well as corresponding measurement results, FIGS. 3A to 3E show other exemplary embodiments of the Hall sensor arrangement that are designed for carrying out a fifth and a sixth method for operating a Hall sensor arrangement, as well as corresponding measurement results, and FIGS. 4A and 4B show exemplary embodiments of details of the Hall sensor arrangement.

FIG. 1A shows an exemplary embodiment of a Hall sensor arrangement. The Hall sensor arrangement 10 comprises a Hall sensor 11, a signal source 12 and a determination unit 13. An output of the signal source 12 is connected to an input of the Hall sensor 11. An output of the Hall sensor 11 is coupled to a signal input of the determination unit 13. A control output of the determination unit 13 in turn is connected to an input of the signal source 12. The Hall sensor 11 further comprises a Hall element 14, an input circuit 15 and an output circuit 16. The input circuit 15 connects the input of the Hall sensor 11 to the Hall element 14. The Hall element 14 is connected to the output of the Hall sensor 11 by means of the output circuit 16. An evaluation circuit 17 is arranged between the output of the output circuit 16 and the output of the Hall sensor 11. An amplifier 18 is arranged between the output of the output circuit 16 and the evaluation circuit 17.

The determination unit 13 comprises a control circuit 19, a memory 20 and a calculation unit 21. The memory 20 is connected to the signal input of the determination unit 13. In addition, the memory 20 is coupled to the calculation unit 21, as well as the control circuit 19. The calculation unit 21 is likewise connected to the control circuit 19. The control circuit 19 is connected to the control output of the determination unit 13. The determination unit 13 also comprises an additional memory 22 and a subtractor 23. An input of the subtractor 23 is connected to the signal input of the determination unit 13. Another input of the subtractor 23 is coupled to an output of the calculation unit 21 by means of the additional memory 22. The determination unit 13 further comprises a comparator 24, the input side of which is connected to the memory 20 as well as the control unit 19. The determination unit 13 comprises a trigger input 25. The determination unit 13 is realized in the form of a digital signal processor. Alternatively, the determination unit 13 is implemented in the form of a microcontroller or microprocessor.

The signal source 12 delivers an input signal I to the Hall sensor 11. The input signal I is realized in the form of a current.

The signal source 12 is designed in the form of a bias circuit. The Hall sensor 11 provides an output signal V at its output. The output signal V is realized in the form of a voltage. The input circuit 15, the Hall element 14 and the output circuit 16 convert the input signal I into a sensor signal VS. The input circuit 15, the Hall element 14 and the output circuit 16 jointly form a chopped sensor element. The sensor signal VS is converted into an amplified sensor signal AV by the amplifier 18. The evaluation circuit 17 generates the output signal V of the Hall sensor 11 from the amplified sensor signal AV. The evaluation circuit 17 is realized in the form of a de-chop circuit. The evaluation circuit 17 may comprise a switch, an inverter, a comparator or an analog/digital converter. The output signal V is fed to the signal input of the determination unit 13. The output signal V is therefore fed to the memory 20 and the subtractor 23. The subtractor 23 delivers a magnetic field signal SB on its output side. The subtractor 23 is realized in the form of a digital subtractor. A trigger signal STR at the trigger input 25 triggers a calibration in accordance with one of the methods described below.

The input circuit 15 and the output circuit 16 comprise switches. In this way, the terminals of the Hall element 14 are periodically switched over in accordance with the current spinning technique. The sensor signal VS and the amplified sensor signal AV are therefore dependent on the position of the switches in the input and output circuits 15, 16. The evaluation circuit 17 is designed for generating the output signal V from the sensor signal VS or the amplified sensor signal AV, respectively. The output signal V is therefore generated after executing the current spinning technique. The output signal V is generated by the evaluation circuit 17 from the respective values of the sensor signal VS or the amplified sensor signal AV that were generated during one period of a cycle of the current spinning technique. The output signal V therefore now only has a slight offset signal portion that is also referred to as [a] residual offset signal portion. The determination unit 13 is implemented in such a way that it determines a residual offset value in the form of a residual offset voltage VOFF and stores this residual offset value in the additional memory 22. The subtractor 23 therefore subtracts the residual offset voltage VOFF from the output signal V such that the magnetic field signal SB has a significantly reduced residual offset signal portion. The magnetic field signal SB delivered by the subtractor 23 therefore is approximately offset-free. In order to determine the magnetic field signal SB, the subtractor 23 subtracts the value of the residual offset voltage VOFF from all following values of the output signal V in accordance with the following equation:

$$SB = V - VOFF$$

The magnetic field signal SB is directly proportional to the magnetic field B. The current dependence of the residual offset voltage VOFF is calculated in accordance with the following equation:

$$VOFF = k \cdot I^n,$$

wherein VOFF is the value of the residual offset voltage, k is the value of an offset factor, I is the value of the input signal and n is the value of an exponent. The offset factor k is a unitized number. The unit of the offset factor k is Volt/Ampere$^n$.

In a not-shown alternative embodiment, the Hall sensor 11 comprises an analog/digital converter that is arranged between the evaluation circuit 17 and the output of the Hall sensor 11. The output signal V is therefore present in the form of a digital signal.

In an alternative embodiment, the output signal V is realized in the form of a current.

In an alternative embodiment, the input signal I is realized in the form of a voltage. The output signal V may be a voltage or a current.

It is therefore possible to realize four different operating modes of the Hall sensor. 1. Input signal I in the form of a current-output signal V in the form of a voltage. 2. Input signal I in the form of a voltage-output signal V in the form of a voltage. 3. Input signal I in the form of a current and output signal V in the form of a current and 4. Input signal I in the form of a voltage and output signal V in the form of a current. Although the formulas provided above and below are based on an input signal I in the form of a current and an output signal V in the form of a voltage, the described methods can also be used for the three other operating modes of the Hall sensor 11 with correspondingly adapted equations.

In an alternative embodiment, the Hall sensor arrangement 10 comprises additional Hall elements. The additional Hall elements and the Hall element 14 may jointly form a Hall sensor array. The different Hall elements may be connected to one another in parallel and/or in series. The determination unit 13 may be designed for determining angular information from the signal of several Hall sensors. The determination unit 13 may be designed for determining the angular information from the signal of several Hall sensors in accordance with the coordinate rotation digital computer method, abbreviated as CORDIC method. The determination unit 13 may utilize alternative algorithms such as, e.g., the calculation by means of a lookup table for determining the angular information from the signal of several Hall sensors.

Figure 1B:
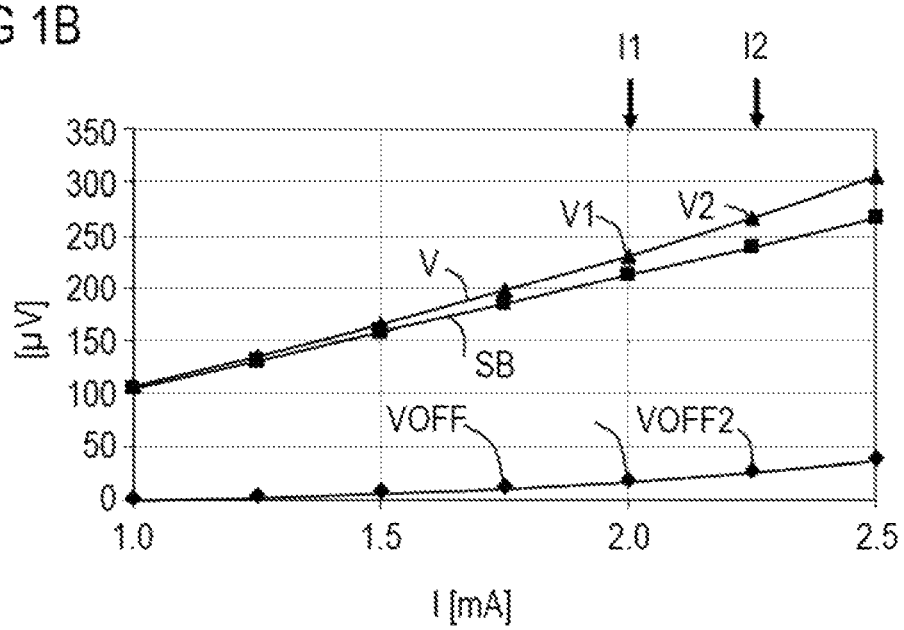

FIG. 1B shows an exemplary measurement on a Hall sensor 11. The output signal V, the residual offset voltage VOFF and the magnetic field signal SB are indicated in dependence on the input signal I.

Figure 1C:
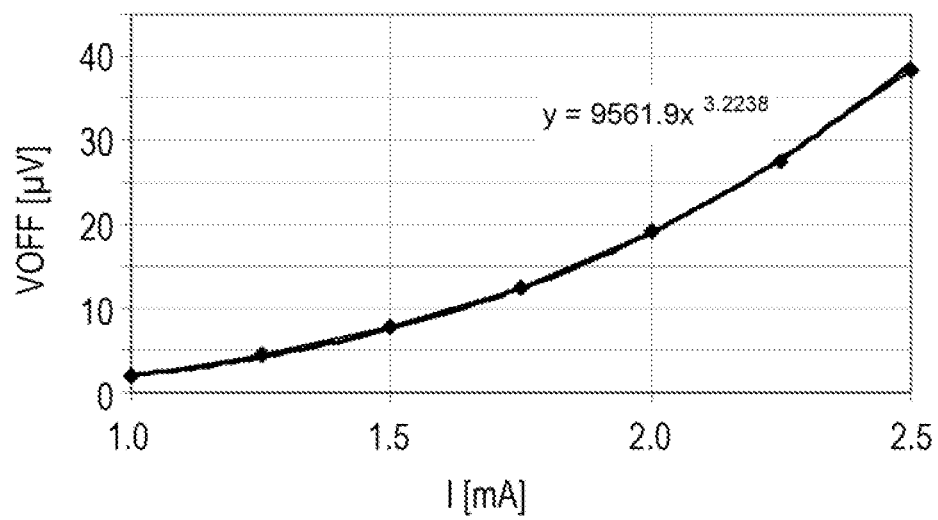

FIG. 1C shows the values of the residual offset voltage VOFF indicated in FIG. 1B in the form of an enlarged representation. In this case, the residual offset voltage VOFF is plotted as a function of the input signal I. The continuous line was calculated from the measured values in accordance with the principle of least square error. In this case, the residual offset value VOFF is proportional to $I^{3.2238}$.

According to the publication "Influence of the Junction Field Effect on the Office [sic; Offset] Voltage of Integrated Hall Plate[s]," P. Ruther et al., Sixteenth European Conference on Solid-State Transducers, Sep. 15-18, 2002, Prague, Czech Republic, pp. 1209-1212, the residual offset voltage VOFF has a quadratic dependence on the input signal I if the cycle of the current spinning technique has two phases. In addition, the residual offset voltage VOFF is proportional to $I^3$ for a current spinning technique, the cycle of which has four phases.

The nonlinear dependence of the residual offset voltage VOFF on the input signal I is used for extracting the residual offset voltage VOFF from at least two measurements that are carried out at two different values of the input signal I. At a first value I1 and a second value I2 of the input signal I, the output signal V of the Hall sensor I1 can be calculated in accordance with the following equation:

$$V1 = B \cdot S(I1) \cdot I1 + VOFF1,$$

$$VOFF1 = k \cdot I1^n,$$

$$V2 = B \cdot S(I2) \cdot I2 + VOFF2,$$

$$VOFF2 = k \cdot I2^n,$$

wherein V1 and V2 respectively are a first and a second value of the output signal, B is the value of a magnetic field, S(I1) and S(I2) respectively are the first and the second value of a sensitivity, I1 and I2 respectively are the first and the second value of the input signal and VOFF1 and VOFF2 respectively are the first and the second value of the residual offset voltage. The absolute value of the first value I1 of the input signal I and the absolute value of the second value I2 of the input signal I are different. The absolute value of the first value I1 of the input signal I is smaller than the absolute value of the second value I2 of the input signal I. The value of the sensitivity S depends on the value of the input signal I and is therefore indicated in the form of the function S(I) with the parameter I in parentheses. The value of the offset factor k can be determined from the above equations in accordance with the following equation:

$$k = \frac{V2 - V1 \cdot \frac{I2 \cdot S(I2)}{I1 \cdot S(I1)}}{I2^n - I1^{n-1} \cdot \frac{S(I2)}{S(I1)}}.$$

At a predefined value Iv of the input signal I, the corresponding value of the residual offset voltage VOFFv and the value of the magnetic field B can therefore be calculated. The predefined value Iv of the input signal I may be equal to the first value I1 or the second value I2 or may be a value of the input signal I that lies between the first value I1 and the second value I2. The following therefore applies:

$$Vv = B \cdot S(Iv) \cdot Iv + VOFFv,$$

$$VOFFv = k \cdot Iv^n,$$

$$I1 \le Iv \le I2$$

$$SB = Vv - VOFFv = B \cdot S(Iv) \cdot Iv.$$

Alternatively, the predefined value Iv of the input signal I may lie outside the range defined by the first value I1 and the second value I2.

At the lower value of the two values I1, I2 of the input signal I, a longer measuring period is adjusted than at the higher value of the two values I1, I2 of the input signal I. The measuring period may be the period of a cycle of the current spinning technique. Consequently, the measuring period may be the sum of the phase periods of the current spinning technique. For example, if I1=2*I2 applies, the overall measuring period may amount to nine minutes, wherein the measuring period at the first value I1 amounts to one minute and the measuring period at the second value I2 amounts to eight minutes. If the overall measuring period is 360 µs, the measuring period at the first value I1 may be 40 µs and the measuring period at the second value I2 may be 320 µs. The ratio of the measuring period at the first value I2 [sic; I1] to the measuring period at the second value I1 [sic; I2] may be greater than the ratio I1/I2 if I1>I2 applies. The ratio of the measuring period at the first value I2 to the measuring period at the second value I1 may be smaller than the ratio I1/I2 if I1<I2 applies. In this way, the influence of noise is reduced.

In a first embodiment of the method, the current dependence of the sensitivity S is neglected. In addition, a predefined value is used for the exponent n. In this way, the above equations can be simplified and the offset factor k, the values of the residual offset voltage VOFF, the magnetic field signal SB and the product of the value of the magnetic field B and the value of the sensitivity S can be calculated in accordance with the following equations:

$$k = \frac{V2 - V1 \cdot \frac{I2}{I1}}{I2^n - I1^{n-1} \cdot I2},$$

$$VOFF1 = k \cdot I1^n,$$

$$VOFF2 = k \cdot I2^n,$$

$$VOFFv = k \cdot Iv^n,$$

$$B \cdot S = \frac{V1 - VOFF1}{I1} = \frac{V2 - VOFF2}{I2} = \frac{Vv - VOFFv}{Iv}$$

$$SB = V1 - VOFF1 = V2 - VOFF2 = Vv - VOFFv.$$

At least one of the values I1, I2, Iv of the input signal I, the offset voltage VOFF and/or the offset factor k are stored in the additional memory 22.

In a second embodiment of the method, not only is the offset factor k determined, but also the value of the exponent n. For this purpose, the first and the second value V1, V2 of the output signal V are measured at the first and the second value I1, I2 of the input signal I and a third value V3 of the output signal V is additionally measured at a third value I3 of the input signal I. The first, the second and the third value I1, I2, I3 of the input signal I exhibit different amounts. The determination of the quantities k, n and VOFF takes place by means of an iterative calculation method. The third value V3 of the output signal V complies with the following equation:

$$V3 = B \cdot S \cdot I3 + VOFF3,$$

$$VOFF3 = k \cdot I3^n,$$

$$I1 < I2 < I3$$

The following equations result from the above equations for the first, second and third value V1, V2, V3 of the output signal V:

$$a \cdot I1^n + b \cdot I2^n + c \cdot I3^{n+1} = 0,$$

$$a = S \cdot I3 \cdot (V2 \cdot S \cdot I3 - V3 \cdot S \cdot I2),$$

$$b = S \cdot I3 \cdot (V3 \cdot S \cdot I1 - V1 \cdot S \cdot I3),$$

$$c = S \cdot (V1 \cdot S \cdot I2 - V2 \cdot S \cdot I1)$$

These equations are numerically solved by the determination unit 13 in order to thusly determine the value of the exponent n and subsequently the value of the offset factor k.

The control circuit 19 adjusts the signal source 12 by means of the control signal SI in such a way that the first value I1 of the input signal I is provided to the Hall sensor 11. The first value V1 of the output signal V of the Hall sensor 11 is then stored in the memory 20 in the determination unit 13. In addition, the control circuit 19 provides the second value I2 of the input signal I by means of the control signal SI and the second value V2 of the output signal V is stored in the memory 20 in the determination unit 13. Furthermore, the control circuit 19 adjusts the signal source 12 by means of the control signal SI in such a way that the third value I3 of the input signal I is delivered to the Hall sensor 11, which in turn provides the third value V3 of the output signal V. The third value V3 of the output signal V is stored in the memory 20. The determination unit 13 calculates the value of the exponent n and the value of the offset factor k from the three predefined values I1, I2, I3 of the input signal I and the three measured values V1, V2, V3 of the output signal V. In addition, the determination unit 13 calculates the value of the residual offset voltage VOFF, for example, at the first, second or third value I1, I2, I3 of the input signal I or another predefined value Iv of the input signal I, as well as the value of the magnetic field signal SB or the value of the product of the value of the magnetic field B and the value of the sensitivity S from the calculated value of the residual offset voltage.

The first and the second embodiment of the method are based on the assumption that the value of the magnetic field B only changes insignificantly over the duration of the calibration phase. It is advantageous to additionally reduce by a factor of 0.5 to 0.01 the residual offset voltage VOFF in comparison with the value of the residual offset voltage VOFF that is already reduced due to the application of the current spinning technique. The effort for carrying out the first and the second embodiment of the method is advantageously maintained low; for example, no coil is required.

The longest measuring period is adjusted at the lowest value of the three values I1, I2, I3 of the input signal I and the shortest measuring period is adjusted at the greatest value of the three values I1, I2, I3 of the input signal I. A measuring period between the shortest and the longest measuring period is adjusted at the middle value of the three values I1, I2, I3.

In an alternative embodiment, the calibration is carried out and subsequently verified. For this purpose, the first value I1 of the input signal I is initially generated, the first value V1 of the output signal V is stored and the second value I2 of the input signal I is subsequently generated during the calibration phase. In order to carry out verification, the measurement is repeated with the first value I1 of the input signal I and the corresponding newly determined value V1' of the output signal V is compared with the first value V1 of the output signal V determined during the calibration phase. The comparison is carried out by the comparator 24 in the determination unit 13. If the two values V1 and V1' correspond, it can be assumed that the intensity of the magnetic field B has not significantly changed during the calibration phase and the determined values for the offset factor k and the exponent n can be used in the ensuing operating phase. Additional measurements are optionally carried out as control measurements. This advantageously makes it possible to detect systematic errors due to unfavorable frequency components.

In an embodiment, at least one value of the input signal I is greater than 1 mA. In an alternative embodiment, at least one value of the input signal I is greater than 2 mA.

Figure 1D:
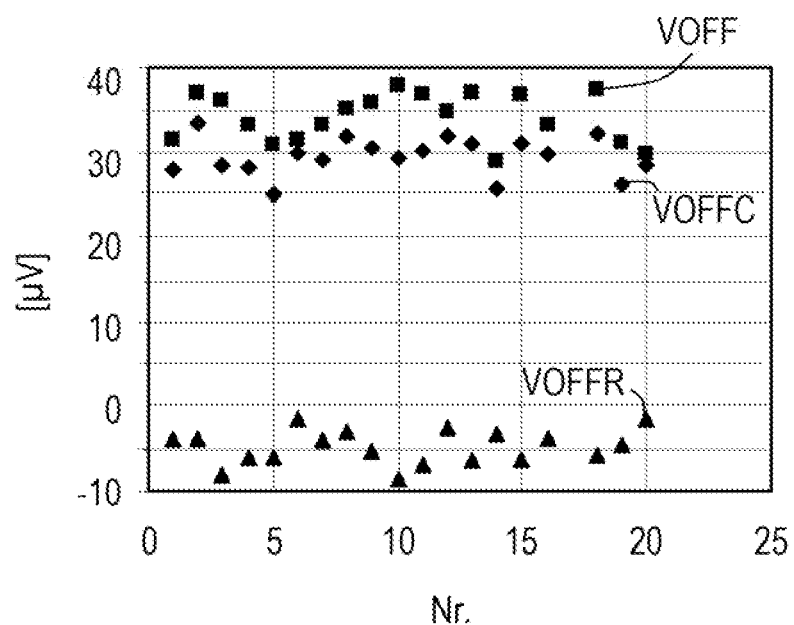

FIG. 1D shows an example of measurement results that were obtained with the first embodiment of the method. In this case, 19 different Hall sensors were analyzed. The value of the input signal I amounted to 2.25 mA. In FIG. 1D, a residual offset voltage VOFF calculated in accordance with the first embodiment of the method, a measured residual offset voltage VOFFC and a remaining residual offset voltage VOFFR are indicated for each of the 19 Hall sensors. The values VOFFC were measured without an externally applied field apart from the earth's magnetic field, wherein the measurement was not shielded against the earth's magnetic field. The values VOFF of the calculated residual offset voltages were extracted with the above-described methods from measurement data determined while an external magnetic field of 1.6 mT was applied. The value VOFFR is the difference between the measured values VOFFC of the residual offset voltage and the calculated values VOFF of the residual offset voltage and corresponds to the intensity of the earth's magnetic field in the measuring chamber. FIG. 1D therefore shows that it is possible to realize an offset calibration while applying an external magnetic field that amounts to 1.6 mT in this case.

FIG. 2A shows another exemplary embodiment of the Hall sensor arrangement. The Hall sensor arrangement 10 according to FIG. 2A represents an enhancement of the Hall sensor arrangement illustrated in FIG. 1A. The Hall sensor arrangement 10 additionally comprises a coil 30 that is coupled to the Hall sensor 11. The coil 30 is arranged on the Hall element 14. The coil 30 is arranged in such a way that the magnetic field generated by the coil 30 contributes to the magnetic field measured by the Hall element 14. The Hall sensor arrangement 10 further comprises a current generator 31, the output of which is connected to the coil 30. Another control output of the determination unit 13 is connected to the current generator 31. The output side of the control circuit 19 is connected to the current generator 31.

The current generator 31 generates a coil current IC that is fed to the coil 30. The magnetic field generated by the coil 30 is proportional to the value of the coil current IC. The determination unit 13 generates another control signal SIC that is fed to the current generator 31 and controls the value of the coil current IC.

FIG. 2B shows another exemplary embodiment of the Hall sensor arrangement that represents an enhancement of the Hall sensor arrangements illustrated in FIGS. 1A and 2A. The signal source 12 comprises a current source 32, the output of which is connected to the Hall sensor 11. The current source 32 is realized in a controlled fashion. The signal source 12 further comprises a digital/analog converter 33. The current source 32 forms a current output of the digital/analog converter 33. The current generator 31 is likewise realized in the form of a current source. The current source of the current generator 31 is implemented in a controlled fashion. The current source of the current generator 31 represents another output of the digital/analog converter 33. The digital/analog converter 33 is therefore realized in the form of a two-channel digital/analog converter.

The evaluation circuit 17 comprises a low-pass filter. The Hall sensor 11 further comprises an analog/digital converter 34 that is arranged between the evaluation circuit 17 and the output of the Hall sensor 11. The output side of the analog/digital converter 34 is connected to the signal input of the determination unit 13. The Hall sensor arrangement 10 further comprises a reference source 35. The reference source 35 is connected to a reference input of the analog/digital converter 34. In FIG. 2B, the memory 20 and the additional memory 22 form a common memory block. The memory 20 and the additional memory 22 comprise memory cells for storing a coil factor CS, different predefined values I1, I2, I3, Iv of the input signal I and/or different predefined values of the coil current IC.

The output side of the control circuit 19 is connected to the input circuit 15, the output circuit 16, the amplifier 18 and the analog/digital converter 34. The control circuit 19 therefore controls the position of the switches of the input and output circuits 15, 16 in order to execute the current spinning technique. The amplifier 18 is adjusted in accordance with the signals for the switches of the input and output circuits 15, 16. The amplifier 18 is realized in the form of a chopping amplifier. The control circuit 19 also controls the analog/digital converter 34. Due to this measure, a measured value is only generated in the form of an output signal V of the determination unit 13 after executing a complete cycle according to the current spinning technique. The reference circuit 15 generates a reference signal VREF that is fed to the analog/digital converter 34.

In a third embodiment of the method, the dependence of the sensitivity S(I) on the input signal I is taken into consideration. The dependence of the sensitivity S(I) on the input signal I is determined by means of the coil 30. The coil 30 is arranged above the Hall sensor 11. At a predefined value I of the input signal, the sensitivity S(I) can be determined from the change of the output signal V in dependence on the coil current IC in accordance with the following equation, wherein i assumes the values one to four that designate the four directions of the current used in the Hall element 14 in accordance with the current spinning technique:

$$S(I) = \frac{\sum_{i=1...4}(V_i^{+IC} - V_i^{-IC})}{4 \cdot I \cdot 2 \cdot IC \cdot CS},$$

wherein $V_i^{+IC}$ is the value of the output signal at a positive coil current and the i-th direction, $V_i^{-IC}$ is the value of the output signal at a negative coil current and the i-th direction, IC is the value of the coil current and CS is the value of the coil factor of the coil 30. The determination of the sensitivity S(I) may be carried out while an external magnetic field is applied. The value of the output signal V is determined with a value 0 of the coil current IC at each value I1, I2 of the input signal I, namely at a positive value and at a negative value of the coil current IC. The absolute values of the positive and of the negative value of the coil current IC are identical. An exact value of the magnetic field signal SB is determined because the determination unit 13 now takes into account the current dependence of the sensitivity S(I).

According to the third embodiment of the method, the sensitivity S(I), as well as the output signal V at the first and the second value I1, I2 of the input signal I, is determined during the calibration phase with the aid of the coil 30. A predefined value is used for the exponent n. The value of the offset factor k therefore can be determined in the calculation unit 21 with the above-described equation as follows:

$$k = \frac{V2 - V1 \cdot \frac{I2 \cdot S(I2)}{I1 \cdot S(I1)}}{I2^n - I1^{n-1} \cdot \frac{S(I2)}{S(I1)}}.$$

The first or the second value I1, I2 of the input signal is used for the measurement during the operating phase. The signal source 12 therefore delivers, for example, the first value I1 of the input signal I. The predefined value for the exponent n, the determined value of the offset factor k and the determined value S(I1) or S(I2) for the sensitivity S(I) at the first or second value I1, I2 of the input signal I subsequently make it possible to continuously determine the time-dependent values of the magnetic field B or of the magnetic field signal SB during the operating phase with the following equations:

$$VOFF1 = k \cdot I1^n,$$
$$VOFF2 = k \cdot I2^n,$$
$$B = \frac{V1 - VOFF1}{I1 \cdot S(I1)} = \frac{V2 - VOFF2}{I2 \cdot S(I2)}$$
$$SB = V1 - VOFF1,$$
$$SB = V2 - VOFF2.$$

According to a fourth embodiment of the method, the corresponding values V1, V2, V3 of the output signal V are determined at least for the first, second and third value I1, I2, I3 of the input signal I and the three values S(I1), S(I2), S(I3) of the sensitivity S(I) are also determined with the aid of the coil 30 at the first, second and third value I1, I2, I3 of the input signal I during the calibration phase. It is therefore possible to initially determine the value of the exponent n and subsequently the value of the offset factor k based on the following equations. The aforementioned iterative calculation method is used for the calculation.

$$a \cdot I1^n + b \cdot I2^n + c \cdot I3^{n+1} = 0,$$
$$a = S(I3) \cdot I3 \cdot (V2 \cdot S(I3) \cdot I3 - V3 \cdot S(I2) \cdot I2),$$
$$b = S(I3) \cdot I3 \cdot (V3 \cdot S(I1) \cdot I1 - V1 \cdot S(I3) \cdot I3),$$
$$c = S(I3) \cdot (V1 \cdot S(I2) \cdot I2 - V2 \cdot S(I1) \cdot I1),$$
$$k = \frac{V2 - V1 \cdot \frac{I2 \cdot S(I2)}{I1 \cdot S(I1)}}{I2^n - I1^{n-1} \cdot \frac{S(I2)}{S(I1)}}$$

Three or more values of the input signal I and the corresponding values of the output signal V are generated.

For example, N values V(I1), V(I2), V(I3), ..., V(IN) of the output signal V are determined for N values I1, I2, I3, ..., IN. In order to carry out the iterative calculation, the first value VOFF1 of the residual offset voltage begins at a starting value n-start of the exponent n determined from the first and the second value V1, V2 of the output signal V, the second value VOFF2 of the residual offset voltage is determined from the second and the third value V2, V3 of the output signal V and the N-1-th value VOFF_N-1 of the offset voltage is determined from the N-1-th and the N-th value V of the output voltage V. The first value n1 of the exponent n is calculated in accordance with the method of least square error. The extraction of the first value VOFF1 is repeated up to the N-1-th value VOFF_N-1 of the residual offset voltage VOFF with the thusly determined first value n1 of the exponent n. The iterative calculations are further continued. The iterative method advantageously converges very fast. Even at an unfavorable initial value such as n=1.1, the result n=3.0 is reached, for example, in two to four iteration cycles.

FIG. 2C shows exemplary measurement results that were determined with the third embodiment of the method. In this case, a value n=3.0 was assumed for the exponent n. The value of the input signal I amounted to 2.25 mA.

FIG. 2D, in contrast, shows an example of measurement results that were obtained with the fourth embodiment of the method. According to FIG. 2D, the determined value of the exponent n differs in the different instances of the Hall sensor arrangements 10 and lies in a range between 2.88 and 3.17. In FIGS. 2C and 2D, the corresponding values of the residual offset voltage VOFF calculated in accordance with the above-described method, the measured residual offset voltage VOFFC and the remaining residual offset voltage VOFFR are indicated for each of the 19 instances of the Hall sensor arrangement. As already explained with reference to FIG. 1D, the values VOFFC were measured while only the earth's magnetic field influenced the Hall sensor 11. The values VOFF of the calculated residual offset voltages were extracted from measurement data obtained under the influence of an external magnetic field of 1.6 mT with the third and fourth embodiment of the method. The value VOFFR is the difference between the measured values VOFFC and the calculated values VOFF and corresponds to the intensity of the earth's magnetic field in the measuring chamber. A particularly high accuracy in the determination of the magnetic field B is advantageously achieved with the third and the fourth embodiment of the method.

FIG. 3A shows another exemplary embodiment of the Hall sensor arrangement. The Hall sensor arrangement 10 according to FIG. 3A represents an enhancement of the embodiments illustrated in FIGS. 1A, 2A and 2B. The determination unit 13 comprises a status signal output 40. The determination unit 13 delivers a status signal STS at the status signal output 40. The status signal STS has a first value during the operating phase and a second value during the calibration phase of the Hall sensor arrangement 10. The status signal STS therefore makes it possible to indicate if the iterative calibration in the calibration phase is completed. The output signal V that can be tapped at the output of the Hall sensor 11 already corresponds to the magnetic field signal SB. The output signal V is fed to the control circuit 19 of the determination unit 13. The output signal V is already free of the residual offset value VOFF as soon as the status signal STS indicates that the calibration phase is successfully completed. The subtractor 23 can therefore be eliminated in the embodiment according to FIG. 3A.

FIG. 3B shows another exemplary embodiment of the Hall sensor arrangement that represents an enhancement of the embodiments illustrated in FIGS. 1A, 2A, 2B and 3A. The memory 20 comprises memory cells for storing the sensitivity S and the coil factor CS. The calculation unit 21 determines the value of the exponent n, the offset factor k and the value of the coil current IC. The coil current IC therefore does not have a predefined value. The coil current IC has a variable value. The coil current IC is provided by means of the digital/analog converter 33 and the current generator 31. The amplifier 18, the evaluation circuit 17 and the analog/digital converter 34 can be jointly referred to as a channel. The evaluation circuit 17 serves for the offset reduction achieved due to the current spinning technique. The calculation circuit 21 calculates the value of the exponent n and the value of the offset factor k in order to determine the value of the coil current IC.

According to a fifth embodiment of the method, the obtained output signal V is free of the residual offset voltage VOFF after the calibration phase. The calibration phase may also be referred to as the start phase. To this end, the residual offset voltage VOFF is compensated with a magnetic field that is generated by means of the coil 30. The value of the coil current IC depends on the value of the input signal I of the Hall sensor 11 and is determined by means of an iterative method during the calibration phase. While the residual offset voltage VOFF is subtracted from the measured value of the output signal V in the first four embodiments of the method, the magnetic field of the coil 30 compensates the residual offset voltage VOFF and the output signal V is directly proportional to the magnetic field B in the fifth embodiment of the method.

The output signal V is measured at the first, second and third value I1, I2, I3 of the input signal I for each determination of the magnetic field B. A quasi-continuous recalibration is therefore carried out. Alternatively, the Hall sensor 11 is calibrated in the calibration phase and the output signal V is subsequently determined at one value only, i.e., at the first, second or third value I1, I2, I3 of the input signal I, in the operating phase. A recalibration can be triggered in accordance with one of the above-described methods.

According to the fifth embodiment of the method, the Hall sensor 11 is acted upon with three different values I1, I2, I3 of the input signal I. The input signal I is realized in the form of a current flowing through the Hall element 14. The residual offset voltage VOFF is reduced at all three values I1, I2, I3 of the input signal I due to the fact that the coil current IC flows through the coil 30. When the residual offset voltage VOFF is exactly compensated by the magnetic field of the coil 30, the output signal V increases linearly with the input signal I. For this condition, the value of the exponent n and the value of the offset factor k can be analytically calculated by the determination unit 13. The method begins with a value of zero of the coil current IC in a first operating point and determines the required values of the coil current IC for the second and third operating point in such a way that a linear relationship between the output signal V and the input signal I is achieved. The input signal I assumes the first value I1 in the first operating point, the input signal I assumes the second value I2 in the second operating point and the input signal I assumes the third value I3 in the third operating point. The value of the exponent n and the value of the offset factor k are calculated from the value of the coil current IC and serve as parameters for the calculation of the coil current IC in the first operating point of the next iteration cycle. Consequently, the value of the exponent n and the value of the offset factor k are determined in an iterative fashion.

The following equations are fulfilled when the residual offset voltage VOFF is compensated by the magnetic field of the coil 30:

$$n = \frac{\ln\frac{\alpha 3 \cdot \gamma 3}{\alpha 2 \cdot \gamma 2}}{\ln\frac{\alpha 3}{\alpha 2}} = 1 + \frac{\ln\gamma 3 - \ln\gamma 2}{\ln\alpha 3 - \ln\alpha 2},$$

$$k = -\frac{S \cdot kc \cdot \gamma 2 \cdot I1}{(I1 \cdot \alpha 2)^{n-1}} = \frac{S \cdot kc \cdot \gamma 2 \cdot I1}{(I1 \cdot \alpha 2)^{(\ln\gamma 2 - \ln\gamma 3)/(\ln\alpha 2 - \ln\alpha 3)}},$$

$$VOFF = k \cdot I2^n,$$

$$V2 = \alpha 2 \cdot V1,$$

$$V3 = \alpha 3 \cdot V1,$$

$$I2 = \alpha 2 \cdot I1,$$

$$I3 = \alpha 3 \cdot I1,$$

$$IC2 = \gamma 2 \cdot I1,$$

$$IC3 = \gamma 3 \cdot I1.$$

The condition for the offset 0 therefore is:

$$k \cdot I1^n + IC1 \cdot kc \cdot S \cdot I1 = 0,$$

$$IC1 = -\frac{I1^{n-1} \cdot k}{S \cdot kc}$$

In this case, CS is the coil factor, S is the sensitivity, V1 is the value of the output signal V at the first value I1 of the input signal I, V2 is the second value of the output signal V at the second value I2 of the input signal I, V3 is the third value of the output signal V at the third value I3 of the input signal I, IC1 is the first value of the coil current, IC2 is the second value of the coil current and IC3 is the third value of the coil current.

The iterative control loop comprises the following elements:

The value of the coil current IC is adjusted to a start value of zero such that the following applies:

$Ic1=0$

The processing of the loop begins with the following starting point:
Setting the first operating point by setting the first value I1 of the input signal I
Storing the first value V1 of the output signal V
Setting the second operating point by setting the second value I2 of the input signal I. In this case, the second value I2 of the input signal I is greater than the first value I1 of the input signal by the factor α2 such that the following applies:

$I2=\alpha2 \cdot I1$

The coil current IC is now adjusted to the second value IC2 such that the second value V2 of the output signal V fulfills the following relationship:

$V2=\alpha2 \cdot V1$

In doing so, the factor γ2 is determined:

$IC2=\gamma2 \cdot I1$

Setting the third operating point by setting the third value I3 of the input signal I. In this case, the third value I3 of the input signal I is greater than the first value I1 of the input signal I by the factor α3 such that the following applies:

$I3=\alpha3 \cdot I1$

The coil current IC is now adjusted to the third value IC3 such that the third value V3 of the output signal V fulfills the following relationship:

$V3=\alpha3 \cdot V1$

In doing so, the factor γ3 is determined:

$IC3=\gamma3 \cdot I1$

In this case, α2 and α3 are predefined values. The values for γ2 and γ3 are determined in the above-described fashion. The value of the exponent n and subsequently the value of the offset factor k can be calculated from the values for α2, α3, γ2 and γ3 in accordance with the following equations:

$$n = \frac{\ln\frac{\alpha3 \cdot \gamma3}{\alpha2 \cdot \gamma2}}{\ln\frac{\alpha3}{\alpha2}},$$

$$k = -\frac{S \cdot kc \cdot \gamma2 \cdot I1}{(I1 \cdot \alpha2)^{n-1}}.$$

The first value of the coil current IC1 can now be calculated based on the following equation and then adjusted. The residual offset voltage VOFF is compensated with the value IC1 for the coil current.

$$IC1 = -\frac{I1^{n-1} \cdot k}{S \cdot kc}.$$

At this point, the loop is completed.

The above-described loop is executed several times until a convergence criterion is fulfilled.

FIG. 3C shows exemplary results that were obtained with the fifth embodiment of the method. In this case, the output voltage V is plotted as a function of the input signal I. The top curve shows the output signal V without compensation, i.e., at a value of zero of the coil current IC. A curve that was obtained in the third iteration step and a curve that was obtained in the sixth iteration step are illustrated underneath. In addition, the magnetic field signal SB that corresponds to an ideal signal is indicated. The value of the magnetic field signal SB is linearly dependent on the value of the input signal I. The output signal V in the sixth iteration step is already very close to the ideal signal. The value of the magnetic field amounted to approximately 50 µT. The calculations were carried out with test data.

FIG. 3D shows another exemplary embodiment of the Hall sensor arrangement 10 that represents an enhancement of the Hall sensor arrangements illustrated in FIGS. 1A, 2A, 2B, 3A and 3B. A compensation unit 37 is arranged between the Hall element 14 and the amplifier 18. The compensation unit 37 comprises a compensation current source 38. The compensation current source 38 is connected to the output of the output circuit 16. The Hall sensor 11 comprises a zero-point detector 41. The zero-point detector 41 is arranged between the evaluation circuit 17 and the output of the Hall sensor 11. The output side of the zero-point detector 41 is connected to the input of the determination unit 13. The zero-point detector 41 comprises a comparator. The evaluation circuit 17 is realized in the form of a low-pass filter. The amplifier 18 is realized in the form of an auto-zero amplifier.

The output signal V of the Hall sensor 11 therefore has the logical values zero and one. The magnetic field signal SB is provided by the calculation unit 21. A compensation current IK flows through the compensation current source 38. The compensation unit 37 eliminates part of the offset. The range for the values of the coil current IC can be maintained small due to the fact that the offset is reduced by means of the compensation unit 37.

A sixth embodiment of the method is realized with the aid of the Hall sensor arrangement 10 illustrated in FIG. 3D. According to the sixth embodiment, the magnetic field B can be determined with the coil current IC that flows through the coil 30. The Hall sensor arrangement 10 may be used as an electronic compass. The sixth embodiment of the method is particularly suitable for determining small values of the magnetic field B.

The value of the exponent n and the value of the offset factor k are extracted in the above-described fashion for the sixth embodiment of the method. A first operating point is set. For example, the third value I3 of the input signal is delivered by the signal source 12 and fed to the Hall sensor 11. The value of the coil current IC is now adjusted in such a way that the third value V3 of the output signal V reaches zero. The portion required for the compensation of the offset is now subtracted from the value of the coil current IC. The remaining value of the coil current IC is therefore proportional to the value of the magnetic field B. The value of the magnetic field B can be calculated therefrom.

The amplifier 18 has a steep conversion characteristic. A small change of the sensor signal VS at the input of the amplifier 18 results in a significant change of the amplified sensor signal AV. The calculation unit 21 calculates the value of the exponent n and the value of the offset factor k, as well as the value of the offset voltage VOFF or the value of the coil current IC that corresponds to the offset voltage VOFF.

The calculation unit 21 further sets the zero-point condition by adjusting the suitable value of the coil current IC.

According to the following equation, the value of the coil current IC is composed of the value IB that is linearly dependent on the value of the input signal I and the value ICOFF that serves for compensating the offset voltage:

$$IC=IB+ICOFF.$$

The value IB is proportional to the value of the magnetic field B. In this case, the measurement of the magnetic field is dependent on the sensitivity S, the coil factor CS and the value of the coil current IC. The values of the sensitivity S and of the coil factor CS can be determined during a production test. These values can be used as predefined parameters over the entire service life of the Hall sensor arrangement 11. The coil current IC advantageously has a better dynamic range than the channel because the channel has to cope with the problem that the offset voltage of the Hall element 14 is higher than the output signal V due to a small value of the magnetic field B.

According to the method, a coil current IC is fed to the coil 30 at the different values I1, I2, I3 of the input signal I. The coil current IC is adjusted in such a way that the zero-point condition is reached by the Hall sensor 11. This means that the output signal V is approximately zero. The value of the coil current IC depends on the magnetic field B and the remaining offset that was calculated in a preceding iteration step. The magnetic field-dependent signal IB can be calculated by subtracting the remaining offset from the value of the coil current IC. The channel is advantageously reduced to a zero-point detector. It is also advantageous that a high linearity of the amplification characteristic is not required for the amplifier 18 in the channel. The measuring accuracy advantageously depends primarily on the digital/analog converter 33 such that a high accuracy can be achieved with little effort. The calibration can be advantageously carried out while an external magnetic field with unknown intensity is applied.

In a preferred embodiment, the output signal V is generated after executing the current spinning technique. The residual offset value is therefore already low. This means that only low values for the coil current IC are required. It suffices to design the coil 30 for low currents.

In an embodiment, the Hall sensor 11 comprises an analog/digital converter in addition to the components illustrated in FIG. 3D. The analog/digital converter is arranged in parallel to the zero-point detector 41. A reference voltage source can be advantageously eliminated because the analog/digital converter is solely utilized for determining the value of the exponent n and the value of the offset factor k. A relative accuracy is sufficient in this case.

In a not-shown alternative embodiment, the coil 30 is coupled to the Hall sensor 11 by means of a current path. In this case, the coil current IC can be additionally utilized as input signal I for the Hall element 14. The coil current IC may therefore flow through the Hall sensor 11 in the form of the input signal I. The coil current IC flows through the coil 30, as well as through the Hall element 14. In this way, a current consumption is advantageously reduced.

In a not-shown alternative embodiment, the Hall sensor arrangement 10 comprises a temperature sensor. The temperature of the Hall sensor arrangement 10 is measured by means of the temperature sensor. The temperature coefficient of the sensitivity S is stored in the memory 20 for correction purposes. In this way, a temperature compensation can be carried out.

In a not-shown alternative embodiment, the Hall sensor 11 comprises the Hall element 14, as well as an additional Hall element. The Hall element 14 and the additional Hall element may be connected to one another in accordance with the principle of "offset reduction by paired interconnection."

In an alternative embodiment, the zero-point detector 41 is realized in the form of a window comparator. The output signal V of the window comparator indicates whether the signal at the input of the zero-point detector 41 lies below a lower threshold value, between the lower threshold value and an upper threshold value or above the upper threshold value. The lower threshold value has a negative value and the upper threshold value has a positive value. The upper and the lower threshold value are close to 0 volt.

The compensation unit 37 may be optionally eliminated. In this case, the output of the output circuit 16 is directly connected to the input of the amplifier 18.

FIG. 3E shows another exemplary embodiment of the Hall sensor arrangement 10 that represents an enhancement of the Hall sensor arrangements illustrated in FIGS. 1A, 2A, 2B, 3A, 3B and 3D. The Hall sensor arrangement 10 comprises a voltage source 42 that is connected to the supply terminals of the Hall sensor 11 and the determination unit 13. The voltage source 42 is realized in the form of a constant voltage source. The voltage source 42 is connected to a reference potential terminal 36 via the Hall sensor 11 and the signal source 12. In this case, the signal source 12, the Hall element 14 and the input circuit 15 are arranged between an output of the voltage source 42 and the reference potential terminal 36. In addition, a junction 43 between the Hall sensor 11 and the voltage source 42 is coupled to a supply voltage terminal 44 by means of a series circuit comprising the coil 30 and the current generator 31. The Hall element 14 is connected to the signal input of the determination unit 13 by means of the output circuit 16, the amplifier 18 and the analog/digital converter 34.

The voltage source 42 provides a supply voltage VD on its output side. The supply voltage VD is fed to the Hall sensor 11 and the determination unit 13 in order to realize their voltage supply. A reference potential VSS can be tapped at the reference potential terminal 36. An additional supply voltage VDD is supplied to the supply voltage terminal 44. The coil current IC generated by the current generator 31 flows from the supply voltage terminal 44 to the Hall sensor 11 and therefore to the Hall element 14 via the junction 43. The voltage source 42 serves as a load balance in this case. The coil current IC may therefore advantageously flow partially or completely through the Hall element 14. In this way, the efficiency of the Hall sensor arrangement 10 is increased.

In an embodiment, the Hall sensor 11 comprises a first number M of Hall elements. This is indicated with the number M of lines between the junction 43 and the Hall element 14 in FIG. 3E.

FIG. 4A shows an exemplary embodiment of details of a Hall sensor arrangement 10 that represents an enhancement of the Hall sensor arrangements illustrated in the above-described figures. The signal source 12 comprises a current source 32 and an additional current source 50. The current source 32 and the additional current source 50 are connected in parallel. An output of the current source 32 and an output of the additional current source 50 are connected to the output of the signal source 12.

The Hall element 14 comprises first, second, third and fourth terminals 51 to 54. The Hall element 14 is realized symmetrical. The first terminal 51 lies opposite the third terminal 53. The second terminal accordingly lies opposite the fourth terminal 55. The input circuit 15 comprises a first and a second multiplexer 55, 56. The output circuit 16 likewise comprises a third and a fourth multiplexer 57, 58. The first, second, third and fourth multiplexers 55 to 58 respectively comprise four inputs that are coupled to the first, second, third and fourth terminals 51 to 54 of the Hall element 14. An output of the first multiplexer 55 is connected to the reference potential terminal 36. An output of the second multiplexer 56 is connected to the output of the signal source 12 via the input of the Hall sensor 11. An output of the third multiplexer 57 and an output of the fourth multiplexer 58 are coupled to the amplifier 18. The amplifier 18 comprises a first and a second input 59, 60. The first input 59 is connected to the output of the third multiplexer 57 and the second input 60 is connected to the output of the fourth multiplexer 58.

The current source 32 and the additional current source 50 are respectively implemented in the form of constant current sources. The current source 32 and the additional current source 50 respectively can be switched on and off separately. The current source 32 delivers a first current value IP1 that corresponds to the first value I1 of the input signal I. The current source 32 is therefore switched on in order to generate the first value I1 of the input signal I. The additional current source 50 delivers a second current value IP2. The sum of the first and the second current value IP1, IP2 corresponds to the second value I2 of the input signal I in this case. The current source 32 and the additional current source 50 are therefore switched on in order to generate the second value I2 of the input signal I. This means that the signal source 12 generates the first and the second value I1, I2 of the input signal I in accordance with the first embodiment of the method.

The not-shown determination unit 13 provides four multiplexer control signals S1 to S4 that are fed to the first, second, third and fourth multiplexers 55 to 58. The current spinning technique that is also referred to as current spinning method or current rotating method is implemented by means of the four multiplexers 55 to 58. A cycle of the current spinning technique comprises at least two phases. Two opposite terminals of the Hall element 14 are respectively coupled to the reference potential terminal 36 and to the output of the signal source 12 via the first and the second multiplexer 55, 56. The two other terminals of the Hall element 14 are accordingly coupled to the first and the second input 59, 60 of the amplifier 18 via the third and the fourth multiplexer 57, 58. The Hall element 14 is sensitive to a magnetic field perpendicular to the surface. The output signal V of the Hall sensor 11 is only generated after the complete execution of the phases of a cycle of the current spinning technique. The value of the input signal I is constant during the phases of a cycle of the current spinning technique. All phases of the cycle according to the current spinning technique are executed in order to determine the output signal V at the first value I1 of the input signal I. Accordingly, the phases of a cycle of the current spinning technique respectively are also completely executed in order to determine the output signal V at the second and/or the third value I2, I3 of the input signal I.

For example, a cycle may comprise four phases. Due to the current spinning technique, the current flow in the Hall element 14 assumes four different directions. The amount of the sensor signal VS is without existing offset identical in all four phases of the current spinning technique. In the four phases of a cycle, each of the four terminals 51 to 54 of the Hall element 14 is therefore connected in a phased fashion to the output of the signal source 12, the reference potential terminal 36, the first input 59 and the second input 60 of the amplifier 18.

The sensor signal VS is realized in the form of a differential signal. The sensor signal VS can be tapped between two terminals of the Hall element 14. The sensor signal VS is fed to the first and the second input 59, 60 of the amplifier 18. The amplifier 18 converts the sensor signal VS into an amplified sensor signal AV. The amplified sensor signal AV refers to the reference potential VSS at the reference potential terminal 36. It is preferred to carry out one of the six above-described embodiments of the method according to the proposed principle in addition to the current spinning technique. The combination of the current spinning technique and one of the six described embodiments of the method results in a high accuracy in the determination of a magnetic field. In an alternative embodiment, the second current value IP2 corresponds to the second value I2 of the input signal. The current source 32 and the additional current source 50 are therefore individually switched on in order to generate the first and the second value I1, I2 of the input signal I.

In an enhancement of the alternative embodiment, the current source 32 and the additional current source 50 are simultaneously switched on. In this case, the sum of the first and the second current value IP1, IP2 corresponds to the third value I3 of the input signal I. The three different values I1, I2, I3 of the input signal I can therefore be efficiently generated with two current sources 32, 50.

In a not-shown alternative embodiment, the signal source 12 comprises an additional current source, the output of which is connected to the output of the signal source 12. In an alternative embodiment, a cycle of the current spinning technique comprises exactly two phases. In this case, the first terminal 51 of the Hall element 14 is coupled to the reference potential terminal 36 and the third terminal 53 of the Hall element 14 is coupled to the output of the signal source 12 via the respective first and second multiplexers 55, 56 in a first phase. In the second phase, the first terminal 51 is coupled to the output of the signal source 12 and the third terminal 53 is coupled to the reference potential terminal 36. The second and the fourth terminal 52, 54 of the Hall element 14 respectively are alternately connected to the first and the second input 59, 60 of the amplifier 36 via the third and the fourth multiplexer 57, 58 in the first and in the second phase. The direction of the current flowing through the Hall element 14 is therefore turned by 180 angular degrees in the two phases of the cycle.

In a not-shown alternative embodiment, the Hall element 14 comprises additional terminals that are coupled to the signal source 12 and the amplifier 18 via the four multiplexers 55 to 58. In this case, a cycle for the operation of such a Hall element 14 may comprise more than four phases.

FIG. 4B shows another exemplary embodiment of a detail of the Hall sensor 11. The Hall sensor 11 comprises the Hall element 14 and an additional Hall element 61. The Hall element 14 and the additional Hall element 61 are connected in accordance with the principle of geometric spinning. The Hall element 14 and the additional Hall element 61 are permanently connected so as to form a Hall element pair and can be used instead of the Hall element 14 in one of the above-described Hall sensor arrangements. The Hall element 14 and the additional Hall element 61 are both coupled to the output of the signal source 12 and the amplifier 18. The direction of the current flow through the Hall element 14 has a certain angle relative to the direction of the current flow through the additional Hall element 61. This angle preferably amounts to 45° or 90°. The outputs of the Hall element 14 and of the additional Hall element 61 are connected in parallel. The connections between terminals of the Hall element 14 and terminals of the additional Hall element 61 are permanent and are not switched over. The Hall element pair comprising the Hall element 14 and the additional Hall element 61 comprises four terminals 62 to 65. A first terminal 62 is connected to the output of the signal source 12, a second terminal 63 is connected to the reference potential terminal 36, a third terminal 64 is connected to the first input 59 of the amplifier 18 and a fourth terminal 65 is connected to the second input 60 of the amplifier 18. The Hall element 14 and the additional Hall element 61 form a parallel circuit with respect to the input signals I and the sensor signals VS. The first and the third terminal 51, 53 of the Hall element 14 respectively are permanently connected to a first and a third terminal 51', 53' of the additional Hall element 61. Likewise, the second and the fourth terminal 52, 54 of the Hall element 14 respectively are permanently connected to a second and a fourth terminal 52', 54' of the additional Hall element 61. Consequently, the input signal terminals 51, 53, 51', 53' of the two Hall element 14, 61 are connected in parallel. In addition, the output signal terminals 52, 54, 52', 54' of the two Hall elements 14, 61 are also connected in parallel. The input signal I may be realized in the form of a current or voltage.

In a not-shown alternative embodiment, the input circuit 15 and the output circuit 16 respectively couple the Hall element pair to the signal source 12 and the amplifier 18. In this case, the four terminals 62 to 65 of the Hall element pair are connected to the output of the signal source 12, the reference potential terminal 36, as well as the first and the second input 59, 60 of the amplifier 18, via the first, second, third and fourth multiplexers 57 [sic; 55] to 58 in accordance with the two or four phases of the current spinning technique.

At least one additional Hall element may be optionally connected to the Hall element 14 and the additional Hall element 61 in accordance with the principle of geometric spinning In a not-shown alternative embodiment, the Hall sensor 11 comprises four Hall elements 14, 61 that are connected to one another. In this case, the current directions through the four Hall elements may have the angles 0°, 45°, 90° and 135° or alternatively 0°, 90°, 180° and 270° relative to a straight line in a first primary surface of a semiconductor body, on which the Hall sensor 11 is arranged.

LIST OF REFERENCE SYMBOLS

10 Hall sensor arrangement
11 Hall sensor
12 Signal source
13 Determination unit
14 Hall element
15 Input circuit
16 Output circuit
17 Evaluation circuit
18 Amplifier
19 Control circuit
20 Memory
21 Calculation unit
22 Additional memory
23 Subtractor
24 Comparator
25 Trigger input
30 Coil
31 Current generator
32 Current source
33 Digital/analog converter
34 Analog/digital converter
35 Reference source
36 Reference potential terminal
37 Compensation unit
38 Compensation current source
40 Status signal output
41 Zero-point detector
42 Voltage source
43 Junction
44 Supply voltage terminal
50 Additional current source
51, 52, 53, 54 Terminal
51', 52', 53', 54' Terminal
55 First multiplexer
56 Second multiplexer
57 Third multiplexer
58 Fourth multiplexer
59 First input
60 Second input
AV Amplified sensor signal
B Magnetic field
CS Coil factor
I Input signal
IC Coil current
IK Compensation current
IP1 First current value
IP2 Second current value
k Offset factor
n Exponent
SB Magnetic field signal
SI Control signal
SIC Additional control signal
STR Trigger signal
STS Status signal
S1, S2, S3, S4 Multiplexer control signals
V Output signal
VD Supply voltage
VDD Additional supply voltage
VOFF Residual offset voltage
VOFFC Measured offset voltage
VOFFR Remaining offset voltage
VREF Reference signal
VS Sensor signal
α2, α3 Scaling factor

The invention claimed is:

1. A method for operating a Hall sensor arrangement, comprising:
    setting at least two different values of an input signal of a Hall sensor of the Hall sensor arrangement that differ with respect to their amount and determining the associated values of an output signal of the Hall sensor, wherein the output signal is only provided after the complete execution of the phases of a cycle of the current spinning technique and the value of the input signal is constant during the phases of the cycle of the current spinning technique such that a first value of the output signal is measured at a first value of the input signal and a second value of the output signal is measured at a second value of the input signal; and
    determining a residual offset value of the output signal in dependence on the values of the output signal that were determined at the at least two values of the input signal.

2. The method according to claim 1, wherein the input signal is realized in the form of a current or voltage.

3. The method according to claim 1 or 2, wherein the at least two values of the input signal or a scaling factor between two values of the set of the at least two values of the input signal are taken into consideration in the determination of the residual offset value.

4. The method according to claim 1 or 2, wherein the Hall sensor arrangement is calibrated during its operation, and
wherein a calibration phase, in which the residual offset value is determined, is carried out between two operating phases, in which the value of a magnetic field is determined in dependence on the residual offset value.

5. The method according to claim 1 or 2, wherein the Hall sensor arrangement is calibrated while an external magnetic field with unknown intensity is applied.

6. The method according to claim 1, wherein the residual offset value is an offset factor or a residual offset voltage and the offset factor and the residual offset voltage are calculated in accordance with the following equation:

$$VOFF = k \cdot I^n;$$

wherein VOFF is the value of the residual offset voltage, k is the value of the offset factor, I is the value of the input signal and n is the value of an exponent.

7. The method according to claim 6, wherein the value of the exponent is predefined.

8. The method according to claim 6, wherein the value of the exponent is determined by setting at least three values of the input signal that differ with respect to their amount and determining the associated values of the output signal of the Hall sensor.

9. The method according to claim 1, wherein the value of a magnetic field is determined in accordance with the following equation:

$$V = B \cdot S \cdot I + VOFF,$$

wherein V is the value of the output signal, B is the value of the magnetic field, S is the value of a sensitivity, I is the value of the input signal and VOFF is the value of a residual offset voltage.

10. The method according to claim 9, wherein the value of the sensitivity is predefined.

11. The method according to claim 9, wherein a coil is arranged relative to the Hall sensor in such a way that the magnetic field of the coil influences the magnetic field detected by the Hall sensor, and
wherein the value of the sensitivity is determined by means of the coil at the at least two values of the input signal.

12. The method according to claim 1, wherein a coil is arranged relative to the Hall sensor in such a way that the magnetic field of the coil influences the magnetic field detected by the Hall sensor, and
wherein the value of a coil current is adjusted in an operating phase in dependence on the residual offset value.

13. The method according to claim 1, wherein a coil is arranged relative to the Hall sensor in such a way that the magnetic field of the coil influences the magnetic field detected by the Hall sensor, and
wherein the value of a coil current is adjusted in an operating phase in such a way that the output signal approximately assumes the value 0.

14. The method according to claim 13, wherein the coil is coupled to the Hall sensor in such a way that the coil current flows through the Hall sensor in the form of the input signal.

15. A Hall sensor arrangement for carrying out the method according to claim 1.

16. A Hall sensor arrangement, comprising:
a Hall sensor that comprises
a Hall element,
an input circuit that connects an input of the Hall sensor to the Hall element, and
an output circuit and an evaluation circuit that connect the Hall element to an output of the Hall sensor, wherein an output signal is only provided by the evaluation circuit after completely executing the phases of a cycle of the current spinning technique;
a signal source that is coupled to the input of the Hall sensor and designed for providing at least two values of an input signal of the Hall sensor that differ with respect to their amount, wherein the value of the input signal is constant during the phases of the cycle of the current spinning technique such that a first value of the output signal is measured at a first value of the input signal and a second value of the output signal is measured at a second value of the input signal; and
a determination unit that is coupled to the output of the Hall sensor and designed for determining a residual offset value of an output signal of the Hall sensor in dependence on the values of the output signal that are determined at the at least two values of the input signal.

17. The Hall sensor arrangement according to claim 16, comprising a coil that is permanently connected to the Hall sensor and arranged relative to the Hall sensor in such a way that the magnetic field detected by the Hall sensor can be influenced by the magnetic field of the coil.

* * * * *